(12) United States Patent
Wan et al.

(10) Patent No.: US 7,230,460 B1
(45) Date of Patent: Jun. 12, 2007

(54) DIGITAL VISUAL INTERFACE

(75) Inventors: S. A. Steve Wan, San Jose, CA (US); Gim S. Tan, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 62 days.

(21) Appl. No.: 10/794,418

(22) Filed: Aug. 26, 2004

Related U.S. Application Data

(60) Provisional application No. 60/451,894, filed on Mar. 4, 2003, provisional application No. 60/451,892, filed on Mar. 4, 2003.

(51) Int. Cl.
*H03L 7/06* (2006.01)

(52) U.S. Cl. ........................ 327/156; 375/355

(58) Field of Classification Search ........... 327/156; 375/355
See application file for complete search history.

(56) References Cited

U.S. PATENT DOCUMENTS 4,700,382 A * 10/1987 Means et al. ......... 379/406.16
6,119,242 A * 9/2000 Harrison .................. 713/503
6,178,339 B1 * 1/2001 Sakai et al. .............. 505/210
2003/0137324 A1 * 7/2003 Park et al. .................. 327/55
2004/0076228 A1 * 4/2004 Park et al. ................. 375/233
2004/0091073 A1 * 5/2004 Smith et al. ............... 375/355

* cited by examiner

*Primary Examiner*—Quan Tra
(74) *Attorney, Agent, or Firm*—Christopher P. Maiorana PC

(57) ABSTRACT

Techniques or designs of circuits to correct distortions in signals transported over a high-speed digital connection between a video source (e.g., a PC or a DVD player) and a digital monitors (such as LCDs) are disclosed. According to one aspect of the present invention, a distorted signal is corrected by an interface circuit that oversamples the incoming signal with clock pulses or signals generated using a phase lock loop (PLL) from a clock seed signal. These clock signals possess different phases that are shifted from each other. In order to support a wide range of data rate, a programmable DPLL is used to produce a number of different ranges of clock frequency (e.g., 4 ranges). In addition, to avoid data phase shift, a delay locked loop (DLL) is used to compensate for the phase shift. A phase detection logic is also used to extract phase information from the oversampled data. The phase information is fed back to the DLL.

18 Claims, 5 Drawing Sheets

DIGITAL VISUAL INTERFACE

CROSS-REFERENCE TO RELATED APPLICATION

This application claims the benefits of U.S. Provisional Application. No. 60/451,894, filed Mar. 4, 2003, and entitled "Digital Visual Interface", and U.S. Provisional Application No. 60/451,892, filed Mar. 4, 2003, and entitled "Digital Phase Lock Loop" both of which are hereby incorporated by reference for all purposes.

BACKGROUND OF THE INVENTION

1. Field of the Invention

The present invention generally relates to the area of integrated circuit designs, and more particularly, relates to a circuitry design and method for preventing signal distortions in transmission between a signal source (e.g., a computer) and a digital display (e.g., a liquid crystal display or LCD).

2. Description of the Related Art

One of the examples of digital displays is liquid crystal displays (LCDs) which is the most common application of liquid crystal technology. From the ubiquitous wrist watch and pocket calculator to an advanced VGA computer screen, this type of display has evolved into an important and versatile interface. A liquid crystal display includes an array of tiny segments (called pixels) that can be manipulated to present information. This basic idea is common to all digital displays, ranging from simple calculators to a full color LCD television.

An LCD is made primarily of two glass plates with some liquid crystal material between them. There is no bulky picture tube. This makes LCDs practical for applications where size (as well as weight) are important. Moreover, LCDs use much less power than their cathode-ray tube (CRT) counterparts. Many LCDs are reflective, meaning that they use only ambient light to illuminate the display. Even displays that do require an external light source (i.e. computer displays) consume much less power than CRT devices.

Different from a CRT that requires an analog signal, an LCD requires digital signals to be continuously fed, wherein the digital signals are organized into individual pixels, rows of pixels, and full-page frames. Any disturbance or video artifact can cause signal distortions in the digital signals that can be visible on the display. There is a need for techniques to minimize or prevent such signal distortions in the signal transmission between a signal source and a digital display.

SUMMARY OF INVENTION

This section is for the purpose of summarizing some aspects of the present invention and to briefly introduce some preferred embodiments. Simplifications or omissions may be made to avoid obscuring the purpose of the section. Such simplifications or omissions are not intended to limit the scope of the present invention.

A high-speed digital connection between a video source (e.g., a PC or a DVD player) and digital monitors (such as LCDs) to support high-resolution monitors has to overcome signal distortion. The present invention relates to techniques or designs of circuits to correct such distortions. According to one aspect of the present invention, a distorted signal is corrected by an interface that oversamples the incoming signal with clock pulses or signals generated using a phase lock loop (PLL) from a clock seed signal. These clock signals possess different phases that are shifted from each other. In order to support a wide range of data rate, a programmable digital phase lock loop (DPLL) is used to produce a number of different ranges of clock frequency (e.g., 4 ranges). In addition, to avoid data phase shift, a delay locked loop (DLL) is used to compensate for the phase shift. A phase detection logic is also used to extract phase information from the over-sampled data. The phase information is fed back to the DLL.

According to one embodiment of the present invention, it is an integrated circuit comprising an input circuit receiving a channel signal from a source, the input circuit providing impedance matching and amplifying the channel signal; a clock generator generating a plurality of clock signals with a substantially identical frequency and a phase shift in reference to an initial clock signal, wherein the initial clock signal is provided in accordance with a frequency in the channel signal, and wherein the clock signals are used to sample the channel signal; a phase detection unit receiving sampled signals and determining one or more adjustments to the clock signals; and a phase alignment circuit receiving the adjustments and correcting the phases in the clock signals such that the channel signal is sampled correctly.

One of the objects in the present invention is to provide a digital visual interface circuit that can be used in applications to support high-speed digital connections between a video source (e.g., a PC or a DVD player) and digital monitors (such as LCDs).

Other objects and advantage together with the foregoing are attained in the exercise of the invention in the following description and resulting in the embodiments illustrated in the accompanying drawings.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE PREFERRED EMBODIMENTS

The present invention pertains to techniques or designs of circuits to correct distortions in signals transported over a high-speed digital connection between a video source (e.g., a PC or a DVD player) and digital monitors (such as LCDs). According to one aspect of the present invention, a distorted signal is corrected by an interface circuit that oversamples the incoming signal with clock pulses or signals generated using a phase lock loop (PLL) from a clock seed signal. These clock signals possess different phases that are shifted from each other. In order to support a wide range of data rate, a programmable DPLL is used to produce a number of different ranges of clock frequency (e.g., 4 ranges). In addition, to avoid data phase shift, a delay locked loop (DLL) is used to compensate for the phase shift. A phase detection logic is also used to extract phase information from the over-sampled data. The phase information is fed back to the DLL.

In the following detailed description of the present invention, numerous specific details are set forth in order to provide a thorough understanding of the present invention. However, it will become obvious to those skilled in the art that the present invention may be practiced without these specific details. In other instances, well known methods, procedures, components, and circuitry have not been described in detail to avoid unnecessarily obscuring aspects of the present invention. The detailed description is presented largely in terms of procedures, logic blocks, processing, and other symbolic representations that directly or indirectly resemble the operations of data processing devices coupled to networks. These process descriptions and representations are the means used by those experienced or skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearance of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Figure 1:
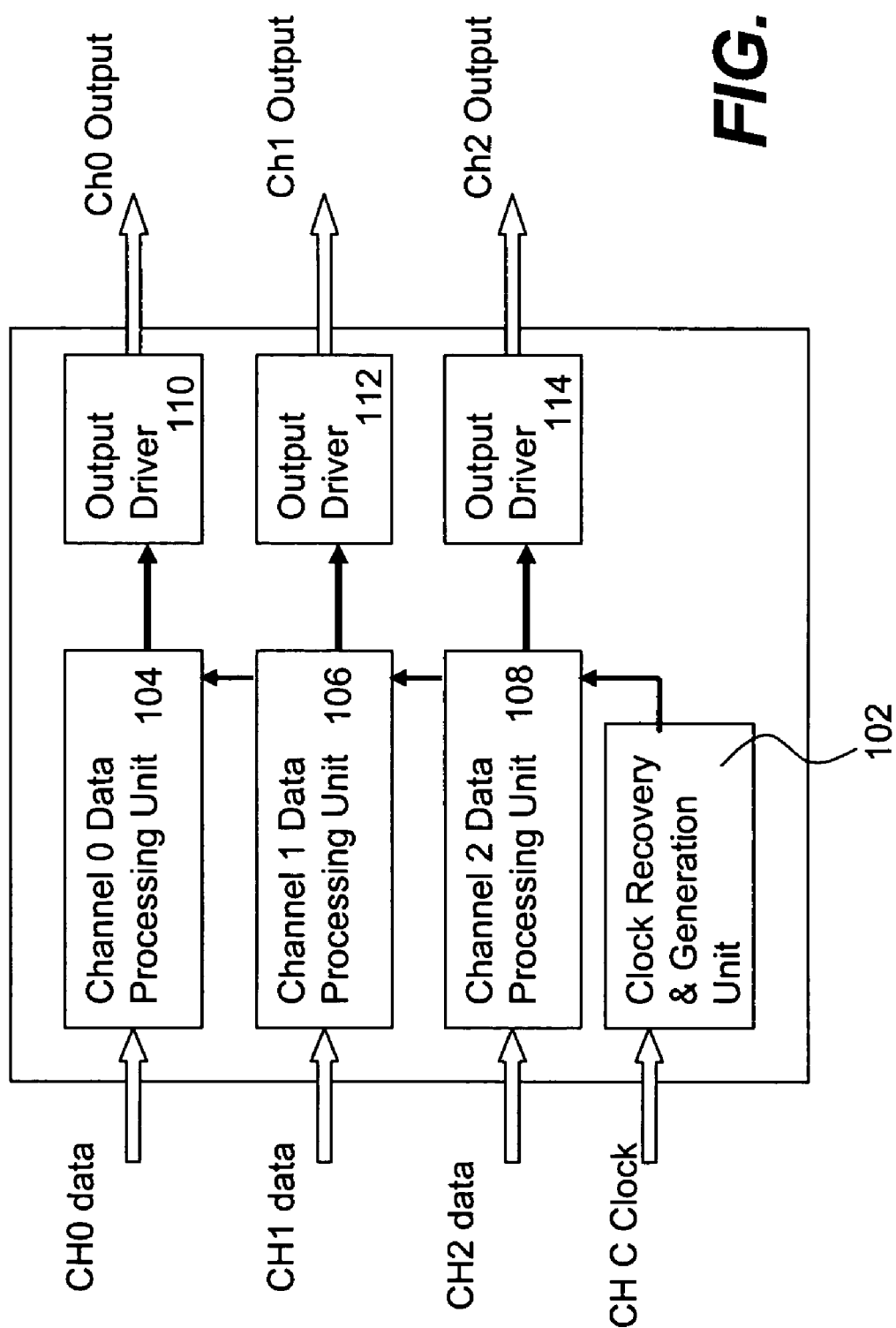
FIG. 1 shows a system architecture according to one embodiment of the present invention.

Referring now to the drawings, in which like numerals refer to like parts throughout the several views, FIG. 1 shows a system architecture 100 according to one embodiment of the present invention. The architecture 100 includes channels for processing data from a signal source (e.g., a computer or a DVD player). Only three channels are shown in FIG. 1. The architecture 100 further includes a clock recovery unit 102. The clock recovery unit 102 generates a plurality of sampling signals in accordance with a feedback signal. One of the purposes of the data channel processing unit (104,106 or 108) is to recover phases in the channel signals labeled, respectively, as CH0 data, CH1 data and CH2 data. As shown in FIG. 1, each of the channels is processed independently in connection with the clock recovery unit 102.

According to one embodiment, the clock recovery unit 102 includes a programmable PLL and a clock generator. According to another embodiment, the clock recovery unit 102 includes a digital phase lock loop (DPLL) circuit.

Figure 2:
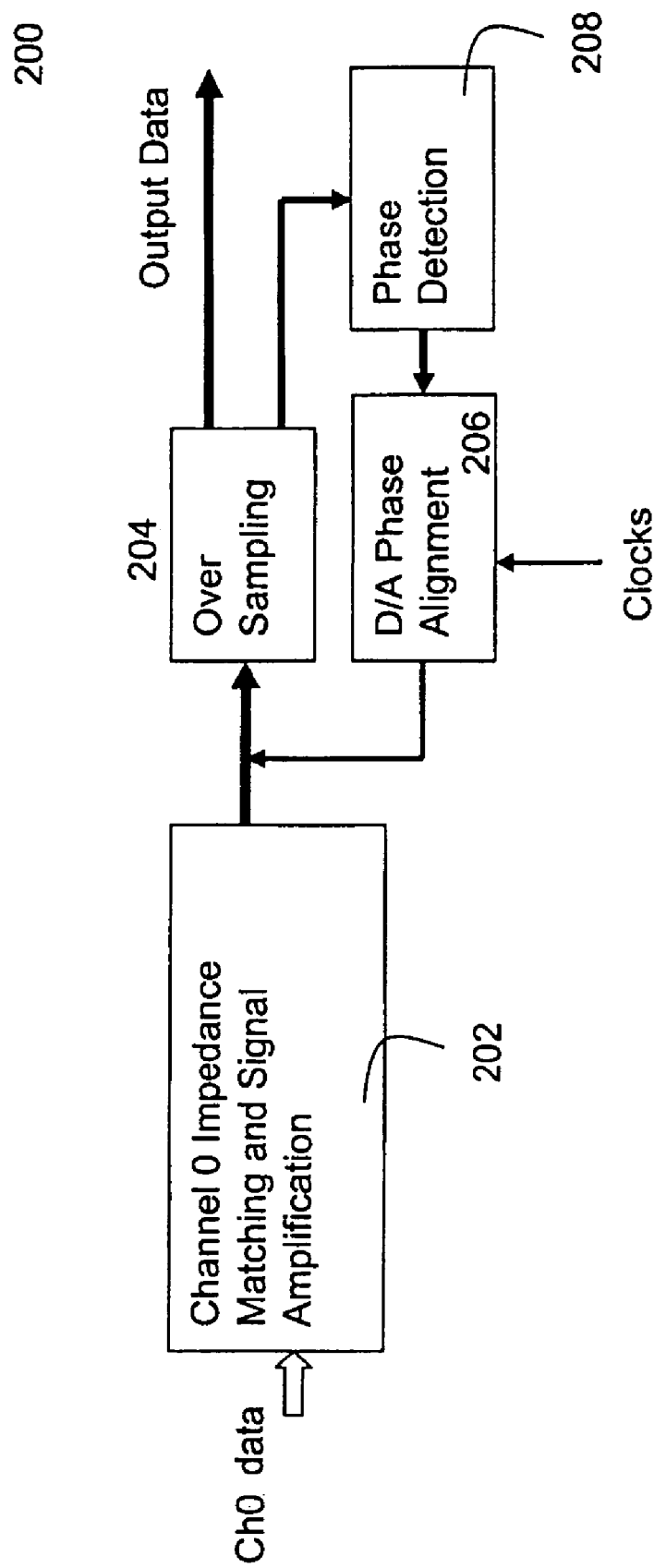
FIG. 2 shows an exemplary implementation of one of the channel processing units of FIG. 1.

FIG. 2 shows an exemplary implementation 200 of one of the channel processing units 104,106 and 108 of FIG. 1. The implementation 200 includes an impedance matching and signal amplification block 202, and a feedback loop formed by an oversampling circuit 204, a D/A phase alignment 206 and a phase detection 208.

Figure 3:
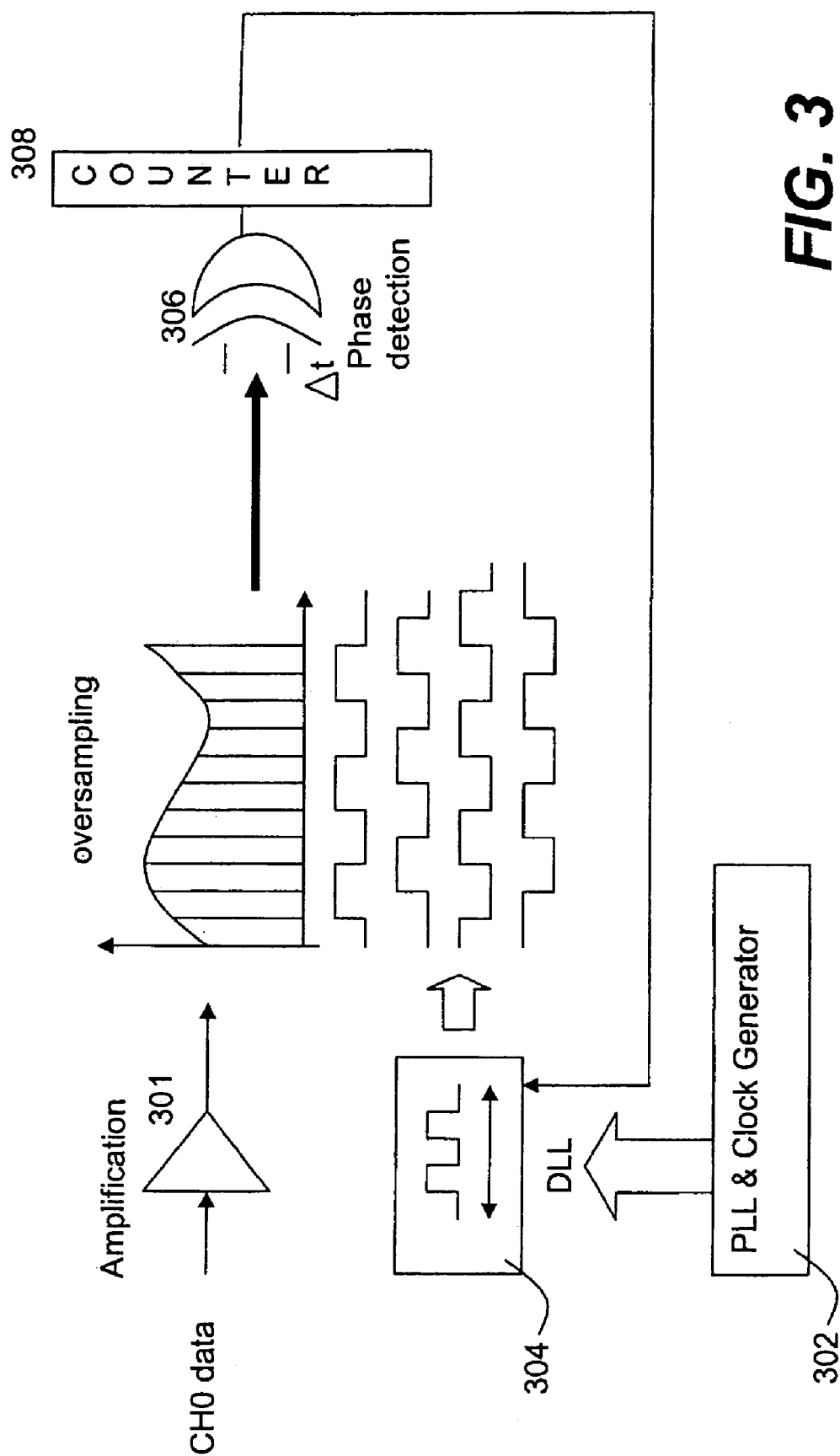
FIG. 3 shows oversampling of an input signal from an amplifier, the oversampling is provided from a PLL and clock generator that operates in accordance with a counter coupled to a phase detector.

In operations and according to one embodiment, an input signal is received at one channel (e.g., as Ch0 data) as shown in FIG. 3. The signal may have been distored after certain transmission. A differential amplifier (e.g., 301 of FIG. 3) receives and amplifies the input signal. Typically, a PLL and clock generator 302 can be configured for different ranges of frequencies. In the embodiment, the PLL 302 is programmed for 4 different frequency ranges. Depedning on the data rate, the PLL 302 can work in frequencies 2.5, 5 or 10 times the input frequencies, which support a range of data rate from 200 Mbit/s to 1.6 Gbit/s.

The clock generator 302 generates, for example, 8 clock signals. The clock signals have a substantially identical frequency and are coupled to a phase alignment unit (e.g., a DLL) 304 for phase shifting. The phase between the clock signals varies and in accordance with the change of the clock frequency. The clock signals are used to oversample the input data as shown in FIG. 3 and FIG. 4.

Figure 5:
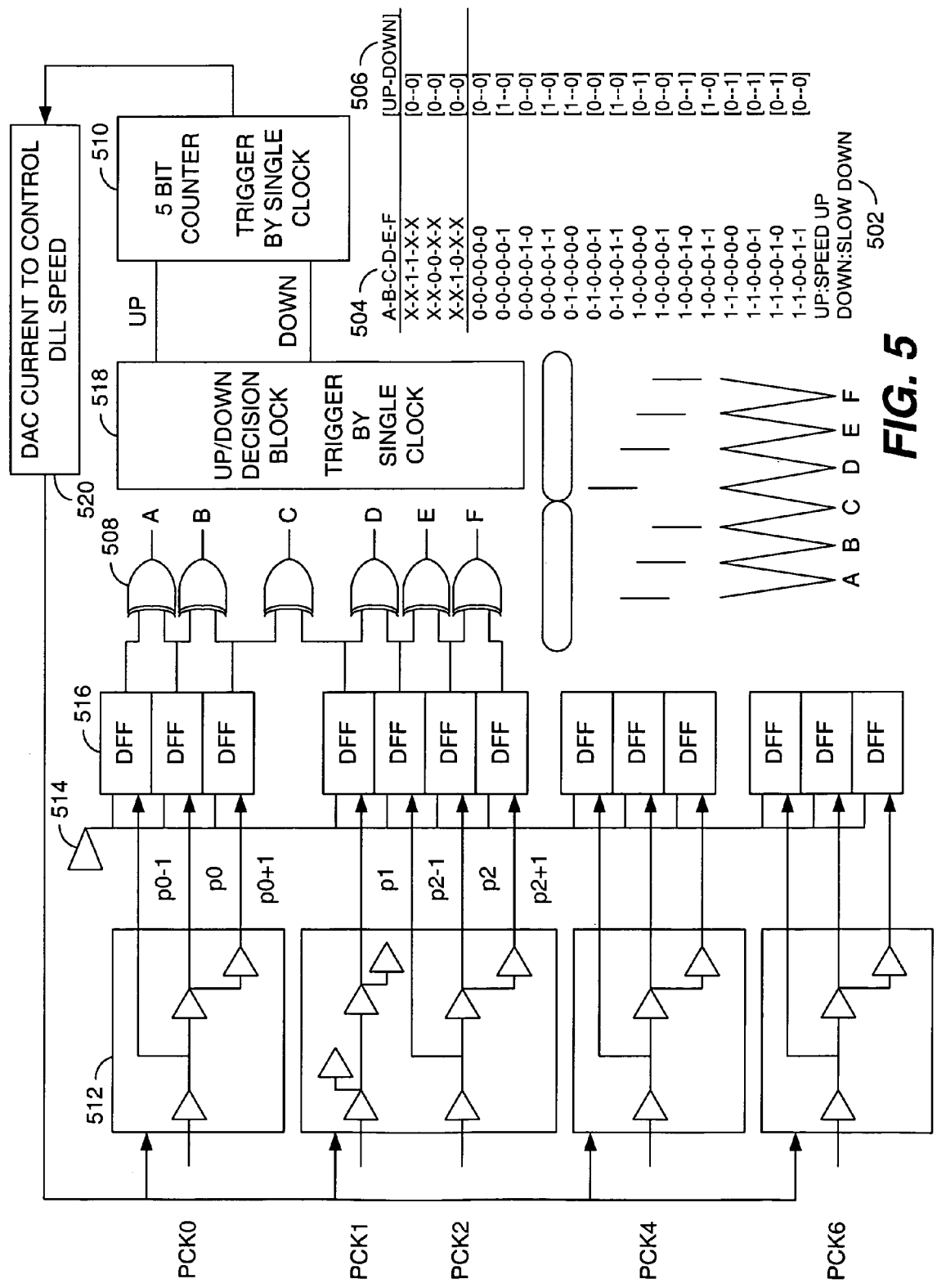
FIG. 5 shows an exemplary circuit implementing the system architecture of FIG. 1.

The oversampled data at the same time is provided to a phase detection block 306 that detects or recovers the phase or phase information in the input signal. A counter 308 determines an offset to facilitate the operation of the DLL 304. According to one embodiment, the phase detection block produces a set of codes. Referring to FIG. 5, a table 502 is shown including a column 504 and a column 506. The column 504 shows possible code values (e.g., A, B, C, D, E, F) from a number of Exclusive-OR gates 508. The column 506 shows corresponding data (e.g., UP-DOWN) for adjusting a counter 510 upwards or downwards to control the speed of a DLL 512. For example, when the output from the gates 508 is 00000, there is no adjustment to the sampling clock signals in the DLL operation. However, when the output from the gates 508 is 10010, there is a downward adjustment to the sampling clock signals in the DLL operation. Such operation or adjustment is performed in the D/A phase alignment 206 of FIG. 2.

Figure 4:
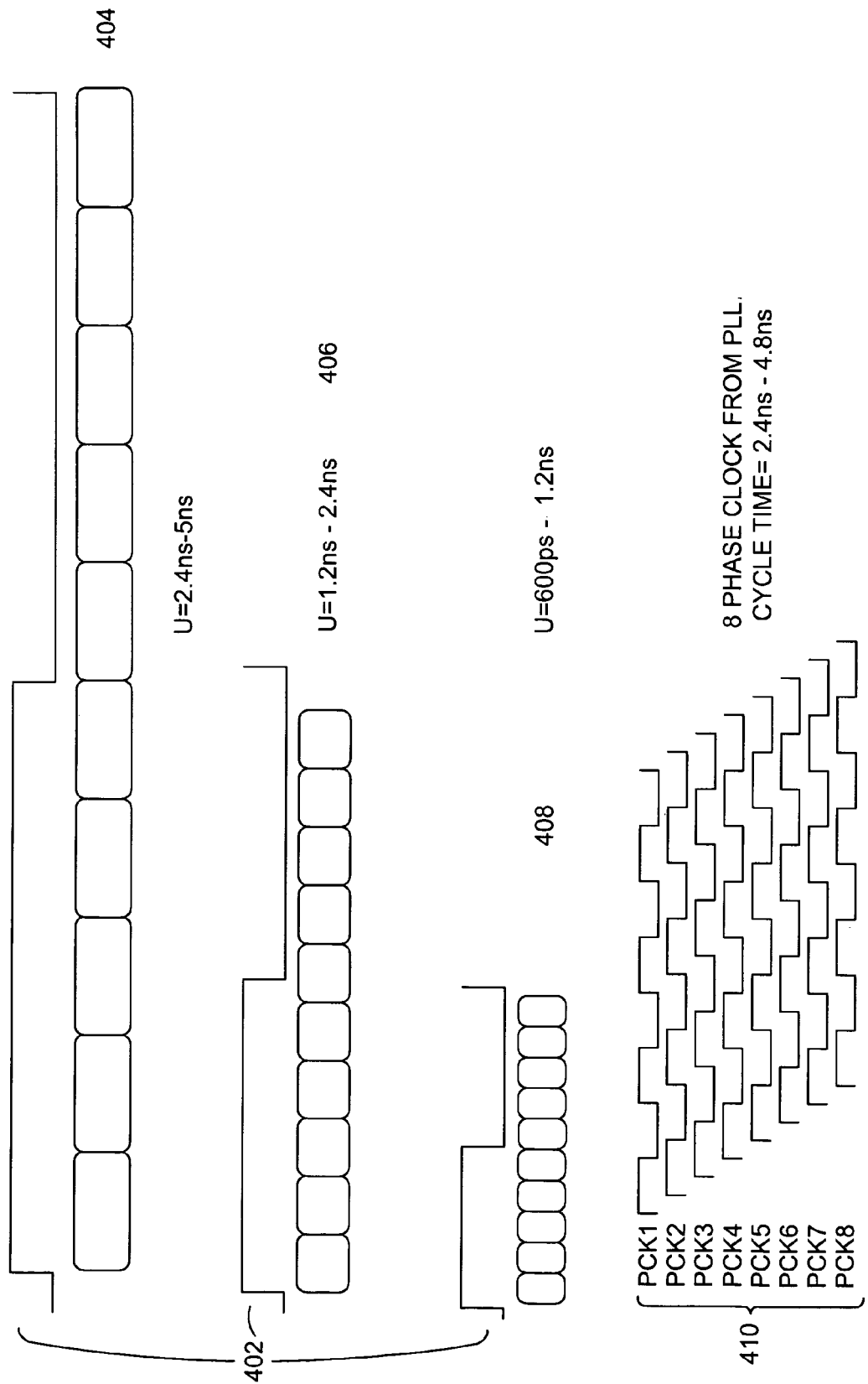
FIG. 4 shows a set of signals with different frequencies being oversampled in accordance with a plurality of sampling signals.

For illustration purpose, an initial clock signal 402 in FIG. 4 is generated or provided in accordance with the data rate of the received input signal. Three different data signals 404, 406 and 408 are illustrated, each having a different signal rate and hence, a different initial clock signal 402. In any case, the initial clock signal is used to produce a plurality of clock signals, each with a phase shift with respect to the initial clock signal 402. FIG. 4 shows that 8 clock signals 410 are generated from the PLL & Clock generator 302 of FIG. 3 in reference to one of the initial clock signals 402.

According to one embodiment, another 8 clock signals can then be generated with a different shift. As a result, 16 clock signals are generated and grouped into four groups, each including four signals. Each group of signals is used to sample or over-sample the received data signal. Typically, one of the clock signals (e.g., the very first one) is used to align with the data signal.

To facilitate the phase shift, the DLL 512 is implemented to adjust the phase of the sampling clock signals (e.g., PCK0–PCK6). The input signal is fed to a sample and hold circuit 514 and data is latched onto a register 516 after amplification. The sampled signal is further passed to the output driver (e.g., 110 of FIG. 1 ) and at the same time the sampled signal is also passed to the phase detection unit (e.g., 208 of FIG. 2, 306 of FIG. 3 or the gates 508 and up/decision block 518 of FIG. 5). The phase detection unit detects the phase of the sampled signal based on the transition of the data. Usually, a determination is made whether an edge of the data is leading or lagging the clock signal.

Once the phase detection unit detects a phase shift, the up/down decision block 518 will signal (e.g., via signals UP and DOWN) a count up or count down of the counter 510. The increment or decrement of the counter 510 triggers the speed-up or speed-down of the DLL 512 by adjusting the delay of the clock signal, which in turn adjusts the phase of all of the sampling clocks. FIG. 5 shows a circuit implementing the architecture 100 of FIG. 1 according to one embodiment of the present invention.

The plurality of Exclusive-OR gates 508 produce a plurality of transition detection signals (e.g., the signals A–F) based on the sampled data signals (e.g., from the register 516). The up/down decision block 518 implements the mapping relationship shown in table 502 to generate adjustment signals (e.g., the signals UP and DOWN) in response to the detection signals A–F. The signals UP and DOWN can be used to control the counter 510. An output of the counter 510 can be used to control the speed of the DLL 512. For example, the output of the counter 510 can be presented to an input of a digital-to-analog converter (DAC) 520. The DAC 520 can generate a current to control the speed of the DLL 512 based on the output of the counter 510.

Referring again to FIG. 2, with the feedback loop formed by the oversampling circuit 204, the D/A phase alignment 206 and the phase detection 208, a shift in the data signal is compensated and therefore, false sampling of the input data is eliminated. Subsequently, a true data signal for each channel is produced and can be used to drive a display.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claim. Accordingly, the scope of the present invention is defined by the appended claims rather than the forgoing description of embodiments.

We claim:

1. An integrated circuit comprising:
   an input circuit configured to receive a channel signal from a source, provide impedance matching and amplify the channel signal;
   a clock generator configured to generate a plurality of clock signals with a substantially identical frequency and a phase shift in reference to an initial clock signal, wherein the initial clock signal is provided in accordance with a frequency in the channel signal;
   an oversampling circuit configured to sample the channel signal in response to the plurality of clock signals;
   a phase detection unit configured to receive sampled signals from the oversampling circuit and generate a first adjustment signal and a second adjustment signal according to a predetermined mapping relationship; and
   a phase alignment circuit configured to adjust the phases of the plurality of the clock signals in response to the first adjustment signal and the second adjustment signal, wherein the phase alignment circuit comprises a delay locked loop configured (i) to receive the plurality of clock signals from the clock generator, (ii) to adjust the phases of the plurality of clock signals in response to an offset signal and (iii) to present the phase adjusted plurality of clock signals to the oversampling circuit, wherein the offset signal is generated in response to the first adjustment signal and the second adjustment signal.

2. The integrated circuit of claim 1, wherein the phase detection unit comprises:
   a logic circuit coupled to the oversampling circuit and configured to generate a plurality of detection signals in response to the sampled signals; and
   a decision circuit configured to generate the first adjustment signal and the second adjustment signal in response to the plurality of detection signals and a clock signal.

3. The integrated circuit of claim 1, wherein the oversampling circuit, the phase detection unit, and the phase alignment circuit form a feedback loop configured to adjust the phases of all of the plurality of clock signals.

4. The integrated circuit of claim 2, wherein the logic circuit comprises a plurality of Exclusive-OR gates configured to receive the sampled signals and present the plurality of detection signals.

5. The integrated circuit of claim 1, further including a counter coupled between the phase detection unit and the phase alignment circuit, wherein the counter is configured to generate the offset signal in response to the first adjustment signal and the second adjustment signal.

6. The integrated circuit of claim 2, wherein the decision circuit comprises a mapping table providing the mapping relationship from the plurality of detection signals to the first adjustment signal and the second adjustment signal.

7. The integrated circuit of claim 6, wherein, depending on the first adjustment signal and the second adjustment signal, the adjustment is zero, a downward adjustment or an upward adjustment to the phases of the plurality of clock signals.

8. The integrated circuit of claim 1, wherein the clock generator works in conjunction with a phase lock loop.

9. The integrated circuit of claim 8, wherein the phase lock loop is one of a programmable PLL or a digital phase lock loop circuit.

10. An integrated circuit comprising (i) at least three channel data processing units configured to receive three input signals representing a video signal and (ii) a clock generator configured to generate a plurality of clock signals with a substantially identical frequency and a phase shift in reference to an initial clock signal, wherein the initial clock signal is provided in accordance with a frequency associated with the three input signals and each of the three channel data processing units are configured to process a respective one of the three input signals and include:
   an input circuit configured to receive the respective input signal, provide impedance matching and amplify the respective input signal;
   an oversampling circuit configured to sample the respective input signal in response to the plurality of clock signals;
   a phase detection unit configured to receive sampled signals from the oversampling circuit and generate a first adjustment signal and a second adjustment signal according to a predetermined mapping relationship; and
   a phase alignment circuit configured to adjust the phases of the plurality of clock signals in response to the first adjustment signal and the second adjustment signal, wherein the phase alignment circuit comprises a delay locked loop configured (i) to receive the plurality of clock signals from the clock generator, (ii) to adjust the phases of the plurality of clock signals in responses to an offset signal and (iii) to present the phase adjusted plurality of clock signals to the oversampling circuit, wherein the offset signal is generated in response to the first adjustment signal and the second adjustment signal.

11. The integrated circuit of claim 10, wherein the phase detection unit comprises:
   a logic circuit coupled to the oversampling circuit and configured to generate a plurality of detection signals in response to the sampled signals; and a decision circuit configured to generate the first adjustment signal and the second adjustment signal in response to the plurality of detection signals and a clock signal.

12. The integrated circuit of claim 10, wherein the oversampling circuit, the phase detection unit, and the phase alignment circuit form a feedback loop configured to adjust the phases of all of the plurality of clock signals.

13. The integrated circuit of claim 11, wherein the logic circuit comprises a plurality of Exclusive-OR gates configured to receive the sampled signals and present the plurality of detection signals.

14. The integrated circuit of claim 10, wherein each channel data processing unit further includes a counter coupled between the phase detection unit and the phase alignment circuit, wherein the counter is configured to generate the offset signal in response to the first adjustment signal and the second adjustment signal.

15. The integrated circuit of claim 11, wherein the decision circuit comprises a mapping table providing the mapping relationship from the plurality of detection signals to the first adjustment signal and the second adjustment signal.

16. The integrated circuit of claim 15, wherein, depending on the first adjustment signal and the second adjustment signal, the adjustment is zero, a downward adjustment or an upward adjustment to the phases of the plurality of clock signals.

17. The integrated circuit of claim 10, wherein the clock generator works in conjunction with a phase lock loop.

18. The integrated circuit of claim 17, wherein the phase lock loop is one of a programmable PLL or a digital phase lock loop circuit.

* * * * *